(12) United States Patent
Chyi et al.

(10) Patent No.: US 8,048,786 B2
(45) Date of Patent: Nov. 1, 2011

(54) METHOD FOR FABRICATING SINGLE-CRYSTALLINE SUBSTRATE CONTAINING GALLIUM NITRIDE

(75) Inventors: Jen-Inn Chyi, Jhongli (TW); Guan-Ting Chen, Jhongli (TW); Hsueh-Hsing Liu, Jhongli (TW)

(73) Assignee: National Central University, Jhongli (TW)

( * ) Notice: Subject to any disclaimer, the term of this patent is extended or adjusted under 35 U.S.C. 154(b) by 576 days.

(21) Appl. No.: 12/263,555

(22) Filed: Nov. 3, 2008

(65) Prior Publication Data

US 2010/0068872 A1 Mar. 18, 2010

(30) Foreign Application Priority Data

Sep. 16, 2008 (TW) ................................. 97135519 A

(51) Int. Cl.
*H01L 21/20* (2006.01)

(52) U.S. Cl. ........ 438/507; 438/462; 438/479; 438/481; 438/503; 438/604; 257/E21.121

(58) Field of Classification Search ........................ None
See application file for complete search history.

(56) References Cited

U.S. PATENT DOCUMENTS

2009/0091002 A1 * 4/2009 Arena et al. .................. 257/623
* cited by examiner

*Primary Examiner* — N Drew Richards
*Assistant Examiner* — Kyoung Lee
(74) *Attorney, Agent, or Firm* — Ming Chow; Sinorica, LLC

(57) ABSTRACT

The present invention provides a method for fabricating a single-crystalline substrate containing gallium nitride (GaN) comprising the following steps. First, form a plurality of island containing GaN on a host substrate. Next, use the plurality of islands containing GaN as a mask to etch the substrate and form an uneven host substrate. Then, perform epitaxy on the uneven host substrate to make the islands containing GaN grow in size and merge into a continuous single-crystalline film containing GaN. Finally, separate the single-crystalline film containing GaN from the uneven host substrate to obtain the single-crystalline substrate containing GaN. According to the present invention, process time can be saved and yield can be improved.

9 Claims, 4 Drawing Sheets

METHOD FOR FABRICATING SINGLE-CRYSTALLINE SUBSTRATE CONTAINING GALLIUM NITRIDE

FIELD OF THE INVENTION

The present invention relates generally to a method for fabricating a single-crystalline substrate, and particularly to a method for fabricating a single-crystalline substrate containing gallium nitride.

BACKGROUND OF THE INVENTION

In 1981, Professor Akasaki of Osaka University in Japan developed successfully a light-emitting diode (LED) using a gallium-nitride (GaN) PN junction. The p-type GaN uses organometallic dicyclopenta magnesium as the source of the dopant magnesium. The grown thin film has to be illuminated by low-energy electron beams to activate the magnesium atoms, and then a p-type GaN thin film is produced. Besides, aluminum nitride is used as the buffer layer grown on a sapphire substrate. The brightness of their first LED using a GaN PN junction is 10 micro-candle power. Nichia Corporation didn't get involved in the research of GaN until 1989. They first innovated a two-stream metal-organic chemical vapor deposition (MOCVD) to grow high-quality GaN thin films. They used a GaN thin film grown at low temperature as the buffer layer, and adopted dicyclopenta magnesium as the source of the p-type dopants. The grown GaN thin film doped with magnesium was thermally treated, but not illuminated by low-energy electron beams as Professor Akasaki had done. In March of 1991, they developed their first LED with a homogeneous PN junction. Next, they also grew successfully indium gallium nitride (InGaN) thin films. In December of 1992, they successfully developed a high-power LED with heterogeneous junctions. Afterwards, they tried to grow LEDs with a single quantum-well structure and a multiple quantum-well structure using aluminum gallium nitride (Al-GaN) or GaN as the confining layers. In 1994 and 1995, they published blue-green and green LEDs with 12 candle power in succession. In 1996, they announced to mass-produce blue-green LEDs.

The major reason for the LED industry to move forward is the success of buffer layer, p-type layer, InGaN active layer, and ohmic contact technologies for blue LEDs. Their structure evolved from homogeneous PN junction and heterogeneous junction (even dual heterogeneous junctions) to single and multiple quantum-well structures.

In comparison with gallium arsenide (GaAs), GaN-system materials, such as aluminum nitride (AlN)-GaN-indium nitride (InN) are semiconductor materials with wide bandgaps. Their bandgaps range from wider-bandgap AlN (bandgap=6.2 eV) to GaN (bandgap=3.4 eV), to narrower-bandgap InN (bandgap=2.0 eV). They can be adjusted to form ternary alloys. If the bandgaps of AlGaN and InGaN (the line connecting GaN and InN on their composition plot) are modulated, the wavelength can be modulated correspondingly. Thereby, LEDs or laser diodes with various colors can be fabricated.

The GaN material grown on a sapphire substrate, which is a hexagonal crystal, using epitaxy technology has a hexagonal structure. However, the lattice constants of the two are different. The lattice constant of the GaN grown epitaxially on a sapphire substrate is smaller than that of sapphire by approximately 16%. The lattice structure of other III-V compound semiconductors, such as GaAs, gallium phosphide (GaP), and indium phosphide (InP), is cubic crystal.

Furthermore, the fabrication technology of single-crystalline GaN substrate according to the prior art adopts MOCVD or hydride vapor phase epitaxy (HVPE) to form GaN bulk. Then laser ablation technology is used to separate the GaN bulk from the substrate and gives the single-crystalline GaN substrate. FIGS. 1A and 1B show schematic diagrams of a fabrication technology for a single-crystalline GaN substrate according to the prior art. First, a single-crystalline GaN bulk 102 is grown on a substrate 100 (as shown in FIG. 1A). Next, laser light is used to heat up the interface between the single-crystalline GaN bulk 102 and the substrate 100 to dissolve GaN into metal Ga and nitrogen molecules. Afterwards, the substrate 100 is heated up to the melting point of metal Ga, and then the single-crystalline GaN bulk 102 and the substrate 100 can be separated (as shown in FIG. 1B). The separated single-crystalline GaN bulk 102 is a single-crystalline GaN substrate. The drawback of this method is that laser is needed to heat up the interface between the single-crystalline GaN bulk and the substrate, which is time-consuming with a low yield.

FIGS. 2A and 2B show schematic diagrams of another fabrication technology for a single-crystalline GaN substrate according to another prior art. T. M. Katona et al. etched the surface of a silicon substrate 200 into a ridge structure 202. Then, GaN is grown on the surface of the silicon substrate 200 and form a single-crystalline GaN substrate 204. The drawback thereof is that GaN crystals 206 will grow at the bottom of the ridge structure 202 as well, which will produce large stress on the ridge structure 202 of the silicon substrate 200. Thereby, cracks might occur on the single-crystalline GaN substrate 204.

Accordingly, the present invention provides a method for fabricating a single-crystalline substrate containing gallium nitride, which can solve the time-consuming and low-yield problems using laser to heat up the interface between the GaN containing substrate and the host substrate. In addition, the present invention can avoid cracks on the single-crystalline GaN substrate by releasing the thermal stress between the GaN containing substrate and the host substrate.

SUMMARY

The present invention provides a method for fabricating a single-crystalline substrate containing gallium nitride, which needs not use a laser to heat up the interface between the GaN containing substrate and the host substrate. Thereby, the purpose of saving time and increasing yield can be achieved.

Another objective of the present invention provides a method for fabricating a single-crystalline substrate containing gallium nitride without cracks.

In order to achieve the objectives described above, the present invention discloses a method for fabricating a single-crystalline substrate containing gallium nitride, which comprises steps of: (1) forming a plurality of islands containing GaN on a host substrate; (2) etching the host substrate by using the plurality of islands containing GaN as a mask, and forming an uneven host substrate; (3) performing gallium nitride-containing epitaxy on the uneven host substrate; and (4) removing the host substrate to give the single-crystalline substrate containing gallium nitride.

DETAILED DESCRIPTION

In order to make the structure and characteristics as well as the effectiveness of the present invention to be further understood and recognized, the detailed description of the present invention is provided as follows along with preferred embodiments and accompanying figures.

In order to solve the problems of laser heating to remove a GaN substrate formed on a host substrate or of cracks on GaN substrate formed on a host substrate, such as silicon, the present invention provides a method for fabricating GaN substrates with improved productivity and yield.

Figure 1A:
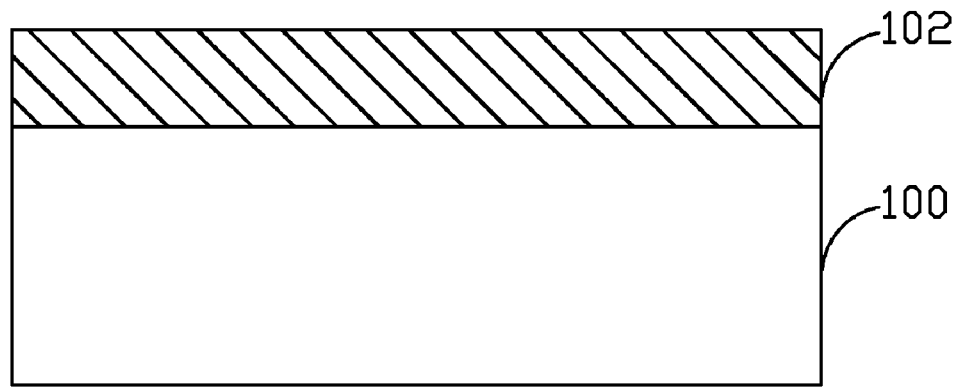
FIG. 1A shows a schematic diagram (1) of a fabrication technology for a single-crystalline GaN substrate according to the prior art.
Figure 1B:
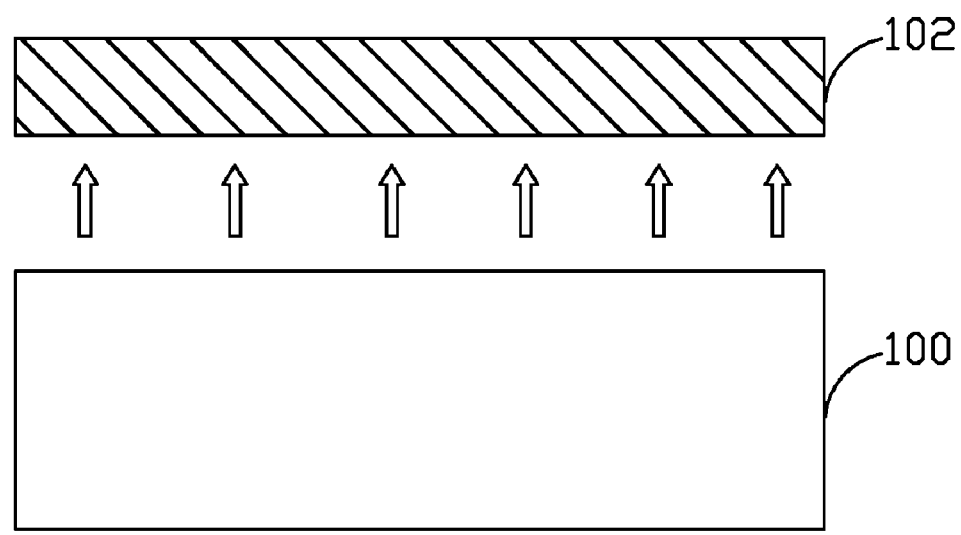
FIG. 1B shows a schematic diagram (2) of a fabrication technology for a single-crystalline GaN substrate according to the prior art.
Figure 2A:
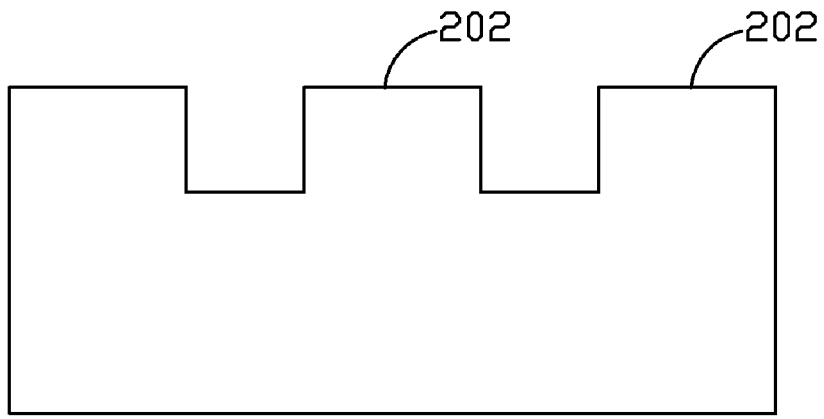
FIG. 2A shows a schematic diagram (1) of another fabrication technology for a single-crystalline GaN substrate according to the prior art.
Figure 2B:
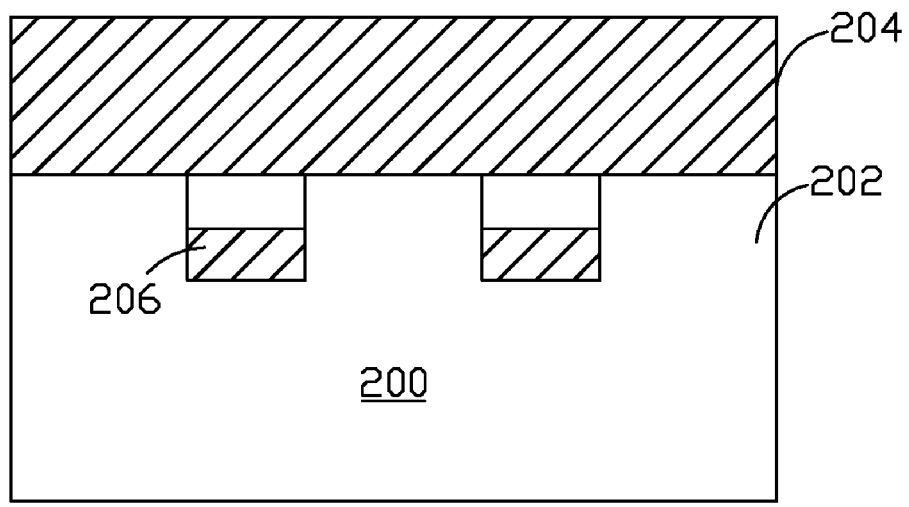
FIG. 2B shows a schematic diagram (2) of another fabrication technology for a single-crystalline GaN substrate according to the prior art.
Figure 3A:
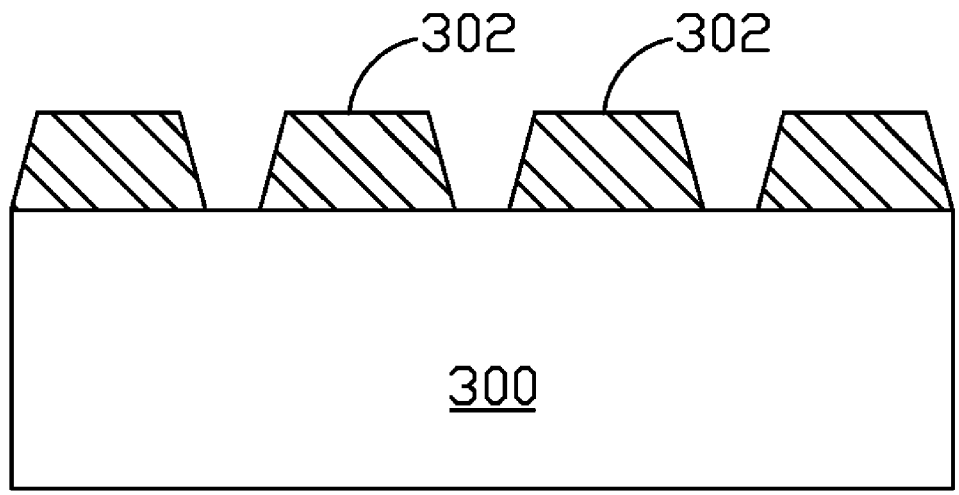
FIG. 3A shows a schematic diagram (1) of the fabrication process according to a preferred embodiment of the present invention.
Figure 3B:
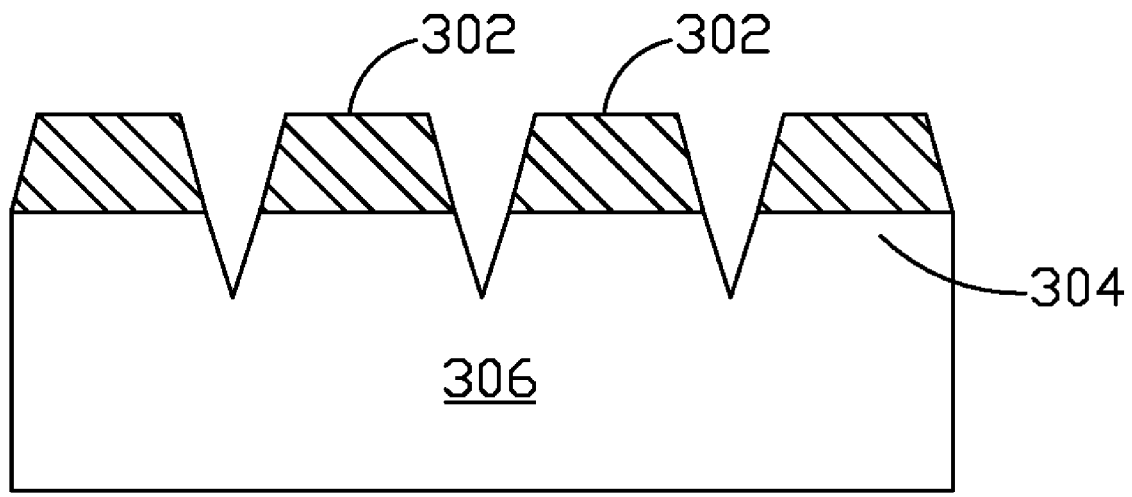
FIG. 3B shows a schematic diagram (2) of the fabrication process according to a preferred embodiment of the present invention.
Figure 3C:
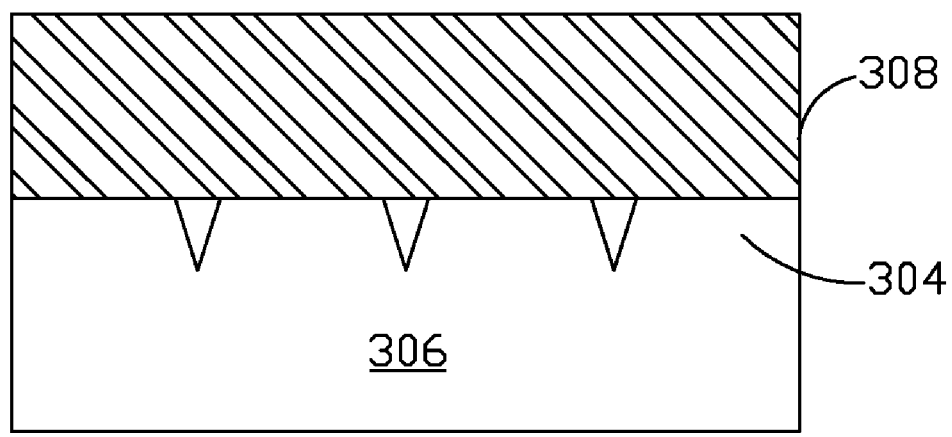
FIG. 3C shows a schematic diagram (3) of the fabrication process according to a preferred embodiment of the present invention.
Figure 3D:
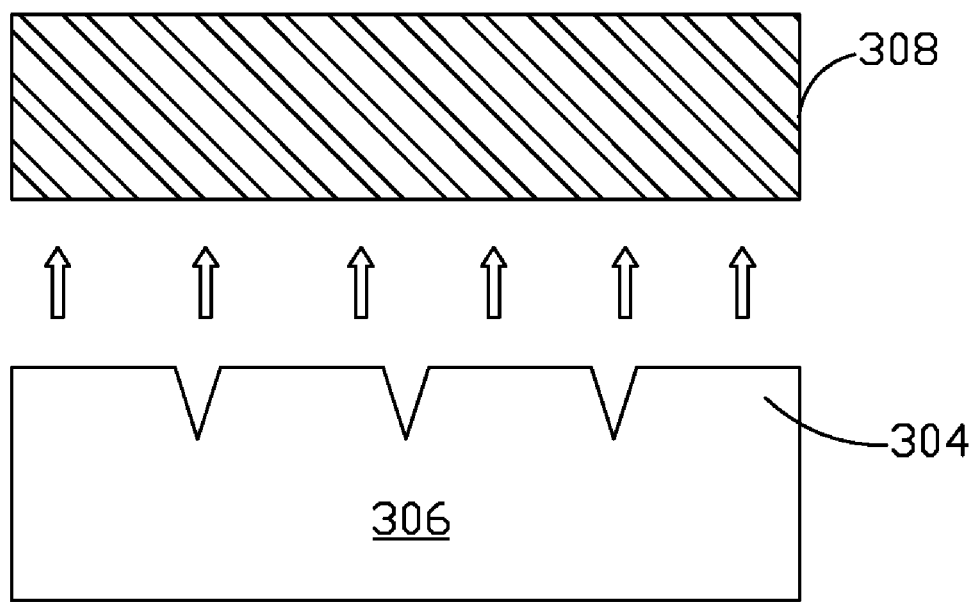
FIG. 3D shows a schematic diagram (4) of the fabrication process according to a preferred embodiment of the present invention.

FIGS. 3A and 3B show schematic diagrams of the fabrication process according to a preferred embodiment of the present invention. As shown in the figures, the present invention provides a method for fabricating a single-crystalline substrate containing gallium nitride, which comprises the following steps. First, provide a silicon substrate 300 and form a plurality of islands containing GaN 302 thereon. Use the plurality of islands containing GaN 302 as a mask and etch the silicon substrate 300 by means of dry or wet etching to form an uneven substrate 306 with a plurality of silicon island structures 304. The plurality of silicon island structures 304 is commensurate with the plurality of islands containing GaN 302. Next, put the uneven Si substrate 306, which has a plurality of islands containing GaN 302, thereon to a crystal growth chamber for growing a material containing GaN. Because the growth of the material containing GaN preferentially takes place at the islands containing GaN because of better lattice match, the material containing GaN will not grow at the recessed areas of the uneven substrate 306. Eventually, the material grown on the islands merge completely to form a continuous single-crystalline substrate containing GaN 308. Then, use wet etching to etch the interface between the single-crystalline substrate containing GaN 308 and the silicon island structures 304 for separating them. A single-crystalline substrate containing GaN 308 is thus obtained.

The material of the host substrate is chosen from the group including sapphire, magnesium oxide, zinc oxide, silicon, silicon carbide, and gallium arsenide. The material containing GaN and the material of the plurality of islands containing GaN are chosen from the group including gallium nitride, aluminum gallium nitride, indium gallium nitride, and aluminum indium gallium nitride. The thickness of the islands containing GaN is between 0.05 μm and 2 μm.

Moreover, the material of the single-crystalline substrate containing GaN can be gallium nitride, aluminum gallium nitride, indium gallium nitride, and aluminum indium gallium nitride. The thickness of the single-crystalline substrate containing GaN is 1~1000 μm.

Preferred Embodiment

1. Prepare a (111) silicon substrate. Use buffer oxidation etching to clean for 30 seconds.
2. Place the (111) silicon substrate to the reactor of MOCVD at temperature of 500~600° C., pressure of 450~600 torr, and V/III ratio of 500~5000 for 1~5 minutes to form a plurality of islands containing GaN.
3. Use the plurality of islands containing GaN as a mask, and use inductively coupled plasma reactive ions to etch the silicon substrate under the following conditions:
   (1) Gas: $BCl_3$: 10 sccm; $Cl_2$: 50 sccm; Ar: 5 sccm;
   (2) Pressure: 7 torr;
   (3) RF power: 50 W;
   (4) Inductively coupled plasma power: 300 W;
   The selectivity under such a condition is approximately GaN: Si=1:10. After etching for 5 minutes, an uneven host substrate, which has silicon island structures commensurate with the plurality of islands containing GaN, is prepared.
4. Place the uneven substrate prepared thereon to the reactor of MOCVD. Because the growth of the material containing GaN preferentially takes place at the islands containing GaN because of better lattice match, the material containing GaN will not grow at the recessed areas of the uneven substrate. Thereby, at temperature of 1000~1200° C., pressure of 75~225 torr, and V/III ratio of 500~5000 for 30~120 minutes, the islands containing GaN become larger and merge to form a continuous GaN film.
5. Place the template prepared in the last step thereon in the chamber of hydride vapor phase epitaxy to grow GaN for 5 hours at temperature of 1000~1100° C., HCl flow rate of 10~100 sccm, $NH_3$ flow rate of 1000~3000 sccm, and pressure of 600~800 torr. The thickness of the continuous GaN film on the uneven substrate is thereby increased to over 300 μm.
6. Etch the wafer prepared in the last step in 50% potassium hydroxide at 80° C. The uneven host substrate and the continuous GaN film is separated because of the voids present at the interface of uneven substrate and the continuous GaN film. A single-crystalline substrate containing GaN is this obtained.

The invention claimed is:

1. A method for fabricating a single-crystalline substrate containing gallium nitride (GaN), comprising steps of:
    forming a plurality of islands containing GaN on a host substrate;
    etching the host substrate by using the plurality of islands containing GaN as a mask, and forming an uneven host substrate;
    performing epitaxy on the uneven host substrate to prepare a continuous film containing GaN; and
    removing the host substrate to obtain a single-crystalline substrate containing GaN.

2. The method of claim 1, wherein the step of forming a plurality of islands containing GaN on a host substrate comprises placing the host substrate to the reactor of metal-organic chemical vapor deposition, molecular beam epitaxy, or hydride vapor phase epitaxy.

3. The method of claim 1, wherein the material of the host substrate in the step of forming a plurality of islands containing GaN on a host substrate is chosen from the group including sapphire, magnesium oxide, zinc oxide, silicon, silicon carbide, and gallium arsenide.

4. The method of claim 1, wherein the material of the plurality of islands containing GaN in the step of forming a plurality of islands containing GaN on a host substrate is chosen from the group consisting of gallium nitride, aluminum gallium nitride, indium gallium nitride, and aluminum indium gallium nitride.

5. The method of claim 1, wherein the thickness of the plurality of islands containing GaN in the step of forming a plurality of islands containing GaN on a host substrate is 0.05~2 μm.

6. The method of claim 1, wherein the material containing GaN in the step of performing epitaxy on the uneven host substrate is chosen from the group consisting of gallium nitride, aluminum gallium nitride, indium gallium nitride, and aluminum indium gallium nitride.

7. The method of claim 1, wherein the step of removing the host substrate to obtain a single-crystalline substrate containing GaN comprises of using potassium hydroxide as the etchant for separating the uneven host substrate and the continuous film containing GaN.

8. The method of claim 1, wherein the material of the single-crystalline substrate containing GaN in the step of removing the host substrate to obtain a single-crystalline substrate containing GaN is chosen from the group consisting of gallium nitride, aluminum gallium nitride, indium gallium nitride, and aluminum indium gallium nitride.

9. The method of claim 1, wherein the thickness of the single-crystalline substrate containing GaN in the step of removing the host substrate to obtain a single-crystalline substrate containing GaN is 1~1000 μm.

* * * * *